US012666751B2

(12) United States Patent
Bailat et al.

(10) Patent No.: US 12,666,751 B2
(45) Date of Patent: Jun. 23, 2026

(54) TRANSPARENT SOLAR CELL FOR AN ELECTRONIC DEVICE AND METHOD FOR MANUFACTURING SAID SOLAR CELL

(71) Applicant: Nivarox-FAR S.A., Le Locle (CH)

(72) Inventors: Julien Bailat, Bienne (CH); Gabriel Christmann, Neuchatel (CH); Didier Dominé, Preles (CH)

(73) Assignee: Nivarox-FAR S.A., Le Locle (CH)

( * ) Notice: Subject to any disclaimer, the term of this patent is extended or adjusted under 35 U.S.C. 154(b) by 43 days.

(21) Appl. No.: 18/417,227

(22) Filed: Jan. 19, 2024

(65) Prior Publication Data

US 2024/0274732 A1 Aug. 15, 2024

(30) Foreign Application Priority Data

Feb. 13, 2023 (EP) ..................................... 23156363

(51) Int. Cl.
H10F 77/20 (2025.01)
G04C 10/02 (2006.01)
(Continued)

(52) U.S. Cl.
CPC .......... H10F 77/247 (2025.01); G04C 10/02 (2013.01); H10F 71/1385 (2025.01);
(Continued)

(58) Field of Classification Search
None
See application file for complete search history.

(56) References Cited

U.S. PATENT DOCUMENTS 4,795,500 A * 1/1989 Kishi ...................... H10F 19/37
136/258
2006/0112987 A1 6/2006 Nakata et al.
(Continued)

FOREIGN PATENT DOCUMENTS

FR 3 018 392 A1 9/2015
GB 2472608 A * 2/2011 ............. H10F 19/37
(Continued)

OTHER PUBLICATIONS

European Search Report issued Jun. 28, 2023 in European Application 23156363.6 filed on Feb. 13, 2023, 3 pages (with English Translation of Categories of Cited Documents).
(Continued)

*Primary Examiner* — Eli S Mekhlin
(74) *Attorney, Agent, or Firm* — Oblon, McClelland, Maier & Neustadt, L.L.P.

(57) ABSTRACT

A solar cell for an electronic device including a substrate made of a transparent material to be exposed to incident light, a first electrode made of transparent electrically conductive material, formed on one face of the substrate and including an inner face opposite an outer face oriented towards the substrate, the inner face including a first portion having a roughness greater than the roughness of a second portion, an absorbent layer extending by an outer face over the first portion of the inner face of the first electrode, a second electrode made of an electrically conductive material and extending over an inner face of the absorbent layer opposite the outer face of the latter, the absorbent layer and the second electrode being perforated to delimit blind cavities, the bottom of each being formed by the second portion of the inner face of the first electrode.

13 Claims, 1 Drawing Sheet

(51) Int. Cl.
   H10F 71/00          (2025.01)
   H10F 77/30          (2025.01)
(52) U.S. Cl.
   CPC ......... H10F 77/211 (2025.01); H10F 77/251
                  (2025.01); H10F 77/315 (2025.01)

(56)                References Cited

U.S. PATENT DOCUMENTS

| | | | |
|---|---|---|---|
| 2008/0178925 A1 | 7/2008 | Wu et al. | |
| 2011/0100424 A1* | 5/2011 | Roche .................... | G02B 1/115 |
| | | | 136/246 |
| 2011/0126894 A1 | 6/2011 | Nishimiya et al. | |
| 2011/0240092 A1 | 10/2011 | Wu et al. | |
| 2021/0013354 A1* | 1/2021 | Liu ........................ | H10F 77/484 |
| 2022/0291638 A1* | 9/2022 | Imboden ................ | G04C 10/02 |

FOREIGN PATENT DOCUMENTS

| | | | |
|---|---|---|---|
| JP | 7-95601 B2 | 10/1995 | |
| JP | 2011-23623 A | 2/2011 | |
| JP | 2013-149852 A | 8/2013 | |
| JP | 2016-201486 A | 12/2016 | |
| WO | WO-0205352 A2 * | 1/2002 | ............. H10F 19/37 |

OTHER PUBLICATIONS

Japanese Office Action issued Jan. 21, 2025, in corresponding Japanese Patent Application No. 2024016134 (with English Translation), 15 pages.

* cited by examiner

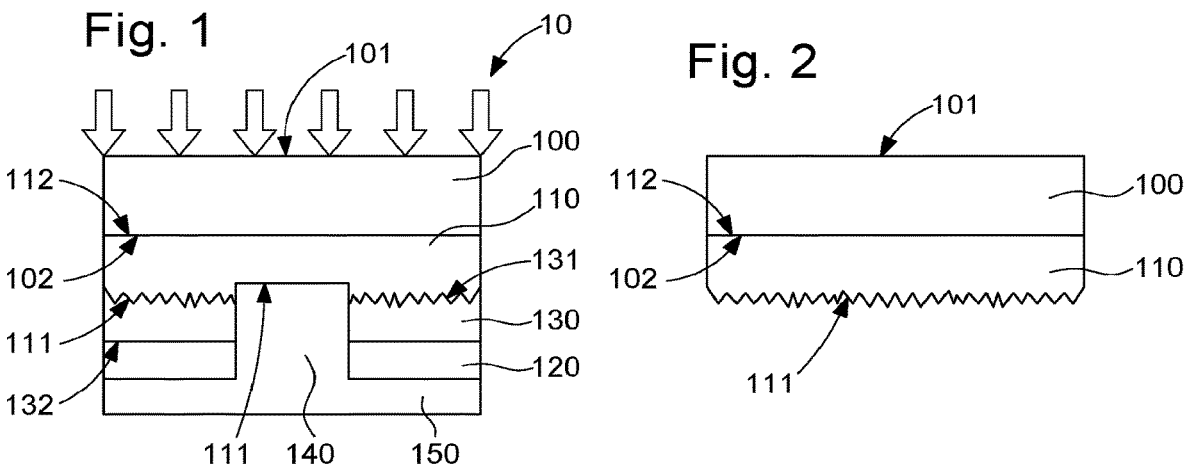
Fig. 1
Fig. 2
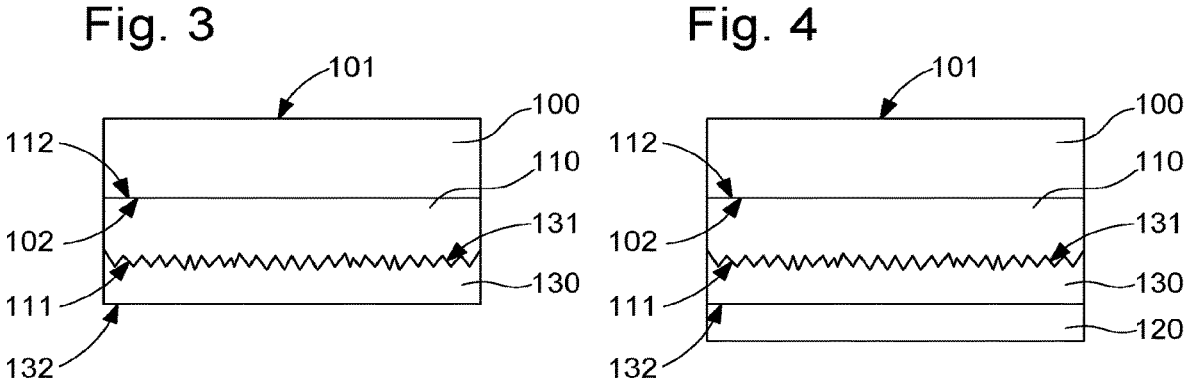
Fig. 3
Fig. 4
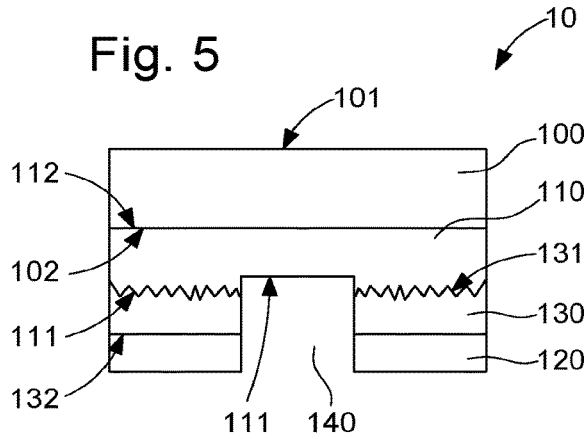
Fig. 5

1

TRANSPARENT SOLAR CELL FOR AN ELECTRONIC DEVICE AND METHOD FOR MANUFACTURING SAID SOLAR CELL

CROSS-REFERENCE TO RELATED APPLICATION

This application claims priority to European Patent Application No. 23156363.6 filed on Feb. 13, 2023, the entire disclosure of which is hereby incorporated herein by reference.

TECHNICAL FIELD OF THE INVENTION

The invention is in the field of transparent solar cells for supplying electrical energy to electronic devices.

More particularly, the invention relates to a solar cell intended in particular, in a preferred application, for the field of watchmaking, that is to say for supplying electrical energy to motor means of a horological movement capable of controlling the display means of a timepiece.

More generally, the solar cell according to the invention is adapted for integration in various transparent objects, such as windows, portholes or windscreens, or in the screens of portable electronic devices, such as electronic tablets, mobile phones and electronic watches.

Technological Background

In certain fields, in particular in the construction, portable electronic and watchmaking device field, the need has arisen for solar cells that can be hidden from a user's view, in order to provide a source of electrical energy while allowing a user to observe therethrough.

This type of solar cell consists, as described in document FR2681189, of an absorbent layer adapted to absorb light and convert it into electrical energy, generally made of a semiconductor material such as silicon, and arranged between a first electrode made of a transparent material and a second electrode made of an opaque metallic material. The first electrode extends over a transparent substrate forming the support for the solar cell.

The transparent layer and the second electrode are perforated up to the transparent substrate in order to obtain the light transmission required to generate the transparency of the solar cell.

In particular, the perforations in the solar cell are dimensioned and distributed in such a way as to allow some of the incident light to pass through the absorbent layer and the second electrode without being absorbed by the latter in order to generate transparency in the solar cell for a user looking at it with the naked eye.

Naturally, it is understood that the larger the surface of the solar cell covered by the perforations, the greater the transparency of the solar cell and the lower its electrical efficiency, and conversely, the smaller the surface, the lower the transparency of the solar cell and the higher its electrical efficiency. Indeed, semi-transparent solar cells allow a portion of the light to pass through while converting the other portion into electricity using the photovoltaic effect.

The requirement for the aesthetic appearance of the solar cell, in particular its transparency, is therefore to the detriment of its electrical efficiency, so that it is necessary to respect a compromise between the level of transparency of the solar cell and its electrical performance.

In order to increase the electrical efficiency of the solar cell, the first electrode can have a roughness on one of its faces that allows it to scatter the light and thus optimise its absorption by the absorbent layer by trapping the incident light radiation. Such a solution is described in document WO2011/083282.

However, the roughness of the first electrode generates a certain scattering factor in the solar cell, also known as the "haze factor". The scattering factor is the ratio of the intensity of the scattered light to that of the total transmitted light. A scattering factor of at least 10% is typically desired to optimise the electrical performance of a solar cell.

This solution is not adapted for a transparent solar cell. Indeed, such a scattering factor is not acceptable for applications specific to a transparent solar cell, in particular the watchmaking application, insofar as this scattering factor will generate a blurring of the solar cell, making it difficult to read the time and perceive the details of the dial.

There is therefore a need to increase the electrical efficiency of solar cells without compromising their transparency.

SUMMARY OF THE INVENTION

The invention overcomes the aforementioned disadvantages by providing a solar cell designed to have a high level of transparency, while providing high electrical performance, that is to say high efficiency.

To this end, the present invention relates to a solar cell for an electronic device, comprising:
- a substrate made of a transparent material intended to be exposed to incident light,
- a first electrode made of transparent electrically conductive material, formed on one face of the substrate and comprising an inner face opposite an outer face oriented towards the substrate, said inner face comprising a first portion having a roughness greater than the roughness of a second portion,
- an absorbent layer extending by an outer face over the first portion of the inner face of the first electrode,
- a second electrode made of an electrically conductive material and extending over an inner face of the absorbent layer opposite the outer face of the latter.

The absorbent layer and the second electrode are perforated so as to delimit a plurality of blind cavities, the bottom of each of which is formed by the second portion of the inner face of the first electrode.

These features maximise both the transparency of the solar cell and its electrical performance.

Indeed, the surface finish of the second portion of the inner face of the first electrode allows to reduce the scattering factor, and the fact that no through openings are created in the first electrode allows to maintain optimum electrical performance, in particular to facilitate current collection by minimising series resistance losses. Moreover, the scattering power is retained where it is useful for the solar cell, that is to say opposite the absorbent layer.

Generally speaking, the present invention has an advantageous application in all fields wherein observation through the solar cell is an important criterion, such as in the field of glazing for buildings or transport, or in the field of electronic devices, such as televisions, electronic tablets or mobile phones.

In particular embodiments, the invention may further include one or more of the following features, taken alone or in any technically possible combination.

In particular embodiments, the first electrode has a thickness comprised between 0.5 and 5 μm, preferably between 1 and 2 μm.

In particular embodiments, the second portion of the inner face of the first electrode has a polished surface finish so as to transmit the light radiation without scattering it.

In particular embodiments, the absorbent layer has a thickness comprised between 100 nm and 1 μm, preferably between 300 and 500 nm.

In particular embodiments, the first and second electrodes are made of transparent conductive oxides.

In particular embodiments, the first and second electrodes are made of zinc oxide, tin oxide or indium tin oxide.

In particular embodiments, the solar cell comprises a transparent protective layer covering the second electrode and filling each cavity.

In particular embodiments, the material of the protective layer is chosen so that it has a refractive index comprised between 1 and 2, preferably between 1.3 and 1.7.

In particular embodiments, the protective layer is made of parylene, polyimide, siloxane, a nitride or an oxide.

In particular embodiments, the substrate is formed by a stack of layers comprising a support layer and an intermediate layer, the latter being interposed between the support layer and the first electrode and being configured so as to have a refractive index comprised between 1.6 and 1.9.

According to another object, the present invention relates to a timepiece including a case comprising a middle part, a glass and a back defining an internal volume wherein a horological movement is housed. The timepiece further includes a solar cell as described above, arranged to supply electrical energy to the horological movement.

In particular embodiments, the solar cell is fixed to the glass so that the substrate is arranged to rest against the latter, with the second electrode facing the internal volume of the case.

In particular embodiments, the glass is formed by the substrate, the solar cell being arranged so that the second electrode faces the internal volume.

In particular embodiments, the substrate forms the dial or is fixed against the latter or against a structure of the horological movement, so that the second electrode faces the glass.

According to another object, the present invention relates to a method for manufacturing a solar cell, comprising the steps of:

forming, on a transparent substrate, a first electrode in the form of an electrically conductive transparent layer provided with an inner face having a roughness such that it is capable of scattering incident light radiation, forming, on the inner face of the first electrode, an absorbent layer adapted to absorb incident light radiation and to generate an electric current therefrom, forming, on the absorbent layer, a second electrode in the form of an electrically conductive layer, structuring the second electrode and the absorbent layer so as to form a plurality of blind cavities extending to the inner face of the first electrode, said structuring step being carried out so as to modify the surface finish of the portion of the inner face of the first electrode onto which each of the cavities opens in order to reduce its roughness.

In particular implementations, during the structuring step, the second electrode and the absorbent layer are successively perforated by implementing a first and a second successive etching operation, the second etching operation being completed by modifying the surface finish of the portion of the inner face of the first electrode onto which each of the cavities opens.

In particular implementations, the second electrode forms an etching mask during the second structuring operation.

In particular implementations, the first electrode is deposited so that its crystals define a predetermined surface finish of its inner face.

In particular implementations, the method comprises a step of depositing a transparent protective layer following the structuring step, so as to cover the second electrode and fill each cavity.

In particular implementations, the substrate is formed, in a preliminary step, by a stack of layers comprising a support layer on which is deposited an intermediate layer intended to be interposed between said support layer and the first electrode.

BRIEF DESCRIPTION OF THE FIGURES

Other features and advantages of the invention will become apparent from the following detailed description, which is given by way of non-limiting example, with reference to the appended drawings wherein:

FIG. 1 schematically shows a cross-sectional view of a solar cell according to the invention;

FIGS. 2 to 5 schematically show a sectional view of the solar cell of FIG. 1 in different steps of a manufacturing method according to the invention.

Note that the figures are not necessarily drawn to scale for reasons of clarity.

DETAILED DESCRIPTION OF THE INVENTION

The description of the invention below is made in the context of an application of the invention to an electronic device formed by a timepiece, for example a watch. However, it goes without saying that the invention is not limited to this application and that it could advantageously be used in any other application.

It should also be noted that the term "transparent" in this text refers to the ability of a material to let all or part of a light radiation pass through, in particular light visible to the naked eye.

The invention relates to a solar cell (10) adapted to transform light radiation into an electric current in order, for example, to power supply, via a power supply circuit, the motor means of a horological movement housed in a case in order to control the display means of a timepiece. The power supply circuit, the motor means and the display means of a timepiece are well known to the person skilled in the art and do not as such relate to the present invention, so they will not be described in detail below and are not shown in the figures.

As shown in FIG. 1, the solar cell 10 includes a substrate 100 made of a transparent material intended to be exposed to light radiation by an outer face 101. The substrate 100 is formed by a layer or by a stack of layers, as described in more detail below in a particular example of implementation of the invention. By way of non-limiting example, the substrate 100 has a thickness comprised between 0.1 and 2 mm, preferably between 0.1 and 0.5 mm.

In one embodiment, the light radiation is an incident radiation or transmitted radiation. In FIG. 1, the incident radiation or transmitted radiation is symbolised by thick arrows.

By way of example, the substrate 100 can be fixed so that its outer face 101 is arranged against a watch glass, for example by adhesive bonding or by mechanical or physical fixing means, such as ionic bonding or pulse current bonding, on its periphery. The light radiation to which the outer face 101 of the substrate 100 is subjected is then radiation transmitted through the glass.

Alternatively, the substrate 100 may constitute the glass of the timepiece. The light radiation to which the outer face 101 of said substrate 100 is subjected is then incident radiation. It is conceivable, in particular in this case, that the substrate 100 includes an anti-reflective treatment on its outer face 101 in order to maximise the amount of light radiation received through said substrate 100.

In another application of the invention, the substrate 100 can be fixed so that its outer face 101 is arranged against the dial or against a structure of the horological movement of a watch, for example by gluing or by mechanical fixing means on its periphery.

Alternatively, the substrate 100 can form the dial.

This substrate 100 is made, for example, of glass, sapphire or a polymer, such as polyethylene naphthalate, also known by the acronym "PEN", or polyethylene terephthalate, also known by the acronym "PET". Other polymers such as polycarbonate (PC) or acrylic polymethyl methacrylate (PMMA) are also possible.

The solar cell 10 also includes a first electrode 110 formed on all or part of a surface of an inner face 102 of the substrate 100 opposite the outer face 101. This first electrode 110 is directly exposed to light radiation transmitted through the substrate 100, from the radiation passing through said substrate 100. By way of a non-limiting example, the first electrode 110 has a thickness comprised between 0.5 and 5 μm, preferably between 1 and 2 μm.

The first electrode 110 is made of a transparent electrically conductive material, for example of a metal oxide, also known by the acronym "TCO", such as zinc oxide (ZnO), tin oxide ($SnO_2$) or indium tin oxide (ITO), and comprises an inner face 111 opposite an outer face 112 oriented towards the substrate 100. The inner face 111 comprises a first and a second portion having surfaces of different roughness. In particular, the first portion of the inner face 111 has a roughness greater than the roughness of the second portion, as shown in FIG. 1. Advantageously, thanks to the roughness of the first portion, the first electrode 110 scatters the incident light radiation.

More precisely, the roughness of the first portion of the inner face 111 is preferentially due to the arrangement of the crystals of the material of the first electrode 110, the deposition method of the first electrode 110 and its parameters being chosen so as to control said arrangement. In other words, the first electrode 110 is deposited so that its crystals define a predetermined surface finish of its inner face 111.

The second portion advantageously has a polished surface so as to transmit the light radiation without scattering it and so as to reduce the scattering factor of the solar cell 10. This feature advantageously helps to increase the transparency of the solar cell 10 and therefore allows a user to see clearly through the solar cell 10.

The solar cell 10 includes an absorbent layer 130 arranged between the first electrode 110 and a second electrode 120. As can be seen in FIG. 1, the absorbent layer 130 extends by an outer face 131 only over the first portion of the inner face 111 of the first electrode 110 and has, for example, a thickness comprised between 100 nm and 1 μm, and preferably comprised between 300 and 500 nm.

The absorbent layer 130 is made of a semiconductor material, such as silicon, for example amorphous silicon. The absorbent layer 130 is adapted to absorb light radiation and to generate an electric current therefrom to terminals connected to the first and second electrodes 110 and 120.

Advantageously and as shown in FIG. 1, the absorbent layer 130 conforms to any point on the surface of the first portion of the inner face 111 of the first electrode 110, so that the outer face 131 of the absorbent layer 130 has a shape complementary to that of said first portion and therefore also an identical roughness.

The second electrode 120 is made of an electrically conductive material and extends over an inner face 132 of the absorbent layer 130 opposite the outer face 131 of the latter.

Advantageously, the second electrode 120 can be made of TCO, which enables the absorbent layer 130 to absorb some of the radiation transmitted through the substrate 100 and some of the radiation reflected by any element disposed in the vicinity of the solar cell 10, opposite said substrate 100, that is to say on the side of the second electrode 120. This feature therefore maximises the amount of radiation absorbed by the absorbent layer 130 and thus increases its electrical performance.

In another variant embodiment of the invention, the second electrode 120 is made of a metallic material, such as silver or aluminium.

As can be seen in FIGS. 1 and 5, the absorbent layer 130 and the second electrode 120 are perforated so as to delimit a plurality of blind cavities 140, the bottom of each of which is formed by the second portion of the inner face 111 of the first electrode 110. In other words, the solar cell 10 includes cavities 140 passing through the second electrode 120 and the absorbent layer 130, and extending to the inner face 111 of the first electrode 110.

Thanks to these features, the transmitted light radiation can pass through the solar cell 10 and the latter can have a very good level of transparency, depending on the surface finish of the second portion of the inner face 11 of the first electrode 110 and on the distribution pattern of the cavities 140 and their dimensions.

Advantageously, the cavities 140 can have a circular or hexagonal cross-section. The latter shape has the advantage of minimising electrical loss.

The cross-sections of the cavities 140 may alternatively have all sorts of regular or irregular, geometrically simple or multiple shapes providing a paving opening onto the inner face 111 of the first electrode 110. By way of example, the cavities 140 can be filiform, such as grooves, or polygonal in shape, such as triangular, square, in the shape of letters, logos, etc.

As illustrated in FIG. 1, the solar cell 10 can advantageously include a protective layer 150 made of a transparent material, encapsulating the first and second electrodes 110 and 120, as well as the absorbent layer 130, that is to say it fills each cavity 140. This protective layer 150 is therefore deposited on a side of the solar cell 10 opposite the substrate 100, and protects the solar cell 10 from any external aggression or pollution.

Such a protective layer 150 may be made of parylene, polyimide, siloxane, a nitride, for example silicon nitride, or an oxide, for example silicon oxide.

This layer may have a thickness such that it provides an advantageous optical function. In particular, the material of the protective layer 150 may be chosen so that it has a refractive index comprised between that of the ambient air, which is approximately equal to 1, and that of the first electrode 110, which is approximately equal to 2, so as to minimise optical reflections and further increase the transparency of the solar cell 10 at the cavities 140. In particular, the protective layer 150 is configured so that its refractive index is comprised between 1.3 and 1.7.

In an example of implementation of the invention not shown in the figures, the substrate 100 is formed by a stack of layers comprising a support layer and an intermediate layer, the latter being interposed between the support layer and the first electrode 110 and being configured so as to have a refractive index such that it minimises optical reflections and thus promotes the transparency of the solar cell 10. In particular, the intermediate layer extends, for example, over a thickness comprised between 60 and 100 nm and has a refractive index comprised between 1.6 and 1.9. This intermediate layer can be made of any suitable transparent material.

The support layer can be made of any transparent material, for example a material as mentioned above for the substrate 100.

The present invention also relates to a method for manufacturing a solar cell 10, preferably in accordance with the solar cell 10 described above.

The manufacturing method comprises the following successive steps, shown chronologically in FIGS. 2 to 5 and FIG. 1 respectively.

Advantageously, this method includes a step of forming the first electrode 110 on the substrate 100, so that said first electrode 110 includes, over its entire inner face 111, a roughness such that it is capable of scattering incident light radiation.

This step is followed by a step of forming the absorbent layer 130 on the inner face 111 of the first electrode 110, then a step of forming the second electrode 120 on the absorbent layer 130.

A structuring step is then carried out in order to form a plurality of blind cavities 140 through the second electrode 120 and the absorbent layer 130, to the inner face 111 of the first electrode 110, in particular to the second portion of said inner face 111. The structuring step is carried out so as to modify the surface finish of the second portion of the inner face 111 of the first electrode 110, in order to reduce its roughness.

The areas to be perforated during the structuring step are determined by masking the areas of the second electrode 120 and the absorbent layer 130 to be preserved, for example by photolithography.

During the structuring step, the second electrode 120 and the absorbent layer 130 may be successively perforated by implementing successive etching operations. In particular, a first etching operation may consist in forming a plurality of cavities 140 through the second electrode 120 and extending to the absorbent layer 130, and a second etching operation may be carried out so as to extend the cavities 140 through the absorbent layer 130, to the first electrode 110. This second etching operation is advantageously completed by modifying the surface finish of the second portion of the inner face 111 of the first electrode 110.

Given the materials constituting the second electrode 120 and the absorbent layer 130 respectively, the first etching operation can be carried out using a wet chemical etching method, and the second etching operation can be carried out using a dry etching method, such as a plasma chemical etching method or ion etching method.

Advantageously, the second electrode 120 can be used as an etching mask during the second structuring operation and thus protect the first portion of the inner face 111 of the first electrode 110, on which it is deposited.

As the modification of the surface finish of the second portion of the inner face 111 of the first electrode 110 is carried out during the second etching operation, the cost and manufacturing time of the solar cell 10 is greatly reduced.

Moreover, the fact that the first electrode 110 is not perforated means that its electrical resistance is not increased, the electrical performance of the solar cell 10 is thus preserved.

An optional step of depositing a transparent protective layer 150 can be carried out following the structuring step so as to cover the second electrode 120 and fill each cavity 140.

In particular, this step can be carried out by spin coating, for example if the material of the protective layer 150 is polyimide. This step may alternatively be carried out by a chemical vapour deposition method, if the material of the protective layer 150 is parylene, or by a plasma enhanced chemical vapour deposition method, if the material chosen to form the protective layer 150 is an oxide or a nitride. It is also possible to deposit the protective layer 150 by a physical vapour deposition method, by evaporation or by sputtering, for example in the case where the protective layer 150 is made of nitride.

The substrate 100 can be formed, in a preliminary step, by a stack of layers comprising a support layer on which an intermediate layer is deposited, the first electrode 110 being deposited on the latter. Advantageously, the intermediate layer has a refractive index comprised between 1.6 and 1.9 in order to reduce the reflection of incident light radiation.

The formation of a first electrode 110 can be achieved by the implementation of a chemical vapour deposition method, the formation of the absorbent layer 130 can be achieved by the implementation of plasma assisted chemical vapour deposition and the formation of the second electrode 120 can be achieved by the implementation of a physical vapour deposition method.

Of course, these deposition methods are given by way of indication, as the first and second electrodes 110 and 120 and the absorbent layer 130 can be deposited by any suitable deposition method depending on their respective materials.

More generally, it should be noted that the implementation and manufacture methods considered above have been described by way of non-limiting examples, and that other variants are therefore conceivable.

In particular, the first and second electrodes 110 and 120, as well as the absorbent layer 130 and the protective layer 150 can be formed by a single layer or by a stack of layers.

The invention claimed is:

1. A solar cell that is part of an electronic device, wherein the solar cell comprises:
   a substrate made of a transparent material to be exposed to incident light,
   a first electrode made of transparent electrically conductive material, formed on one face of the substrate and comprising an inner face opposite an outer face oriented towards the substrate, said inner face comprising a first portion and a second portion, the first portion having a roughness greater than a roughness of a second portion of the inner face, wherein the second portion of the inner face of the first electrode has a polished surface finish configured to transmit the incident light without scattering,
   an absorbent layer extending by an outer face over the first portion of the inner face of the first electrode, and
   a second electrode made of an electrically conductive material and extending over an inner face of the absorbent layer opposite the outer face of the absorbent layer, the absorbent layer and the second electrode being perforated so as to delimit a plurality of blind cavities, with the first electrode not being perforated, wherein a bottom of each blind cavity of the blind cavities is formed by the second portion of the inner face of the first electrode having the roughness different from that of the first portion.

2. The solar cell according to claim 1, wherein the first electrode has a thickness between 0.5 and 5 μm.

3. The solar cell according to claim 1, wherein the absorbent layer has a thickness between 100 nm and 1 μm.

4. The solar cell according to claim 1, wherein the first and second electrodes are made of transparent conductive oxides.

5. The solar cell according to claim 4, wherein the first and second electrodes are made of zinc oxide, tin oxide, or indium tin oxide.

6. The solar cell according to claim 1, further comprising a transparent protective layer covering the second electrode and filling each blind cavity.

7. The solar cell according to claim 6, wherein the material of the protective layer has a refractive index between 1 and 2.

8. The solar cell according to claim 6, wherein the protective layer is made of parylene, polyimide, siloxane, a nitride, or an oxide.

9. The solar cell according to claim 1, wherein the substrate is formed by a stack of layers comprising a support layer and an intermediate layer, the intermediate layer being interposed between the support layer and the first electrode and being configured so as to have a refractive index between 1.6 and 1.9.

10. A timepiece, including a case comprising a middle part, a glass, and a back defining an internal volume in which a horological movement is housed, wherein said timepiece further comprises the solar cell according to claim 1, configured to supply electrical energy to the horological movement.

11. The timepiece according to claim 10, wherein the solar cell is fixed to the glass so that the substrate rests against the glass, with the second electrode facing the internal volume of the case.

12. The timepiece according to claim 10, wherein the glass is formed by the substrate, and the second electrode faces the internal volume.

13. The timepiece according to claim 10, wherein the substrate forms a dial or is fixed against the dial or against a structure of the horological movement, and the second electrode faces the glass.

* * * * *